United States Patent [19]

Borowiec et al.

[11] Patent Number: 5,170,337

[45] Date of Patent: Dec. 8, 1992

[54] LOW-INDUCTANCE PACKAGE FOR MULTIPLE PARALLELED DEVICES OPERATING AT HIGH FREQUENCY

[75] Inventors: Joseph C. Borowiec, Schenectady; Otward M. Mueller, Ballston Lake; Sayed-Amr A. El-Hamamsy, Schenectady, all of N.Y.

[73] Assignee: General Electric Company, Schenectady, N.Y.

[21] Appl. No.: 827,310

[22] Filed: Jan. 29, 1992

[51] Int. Cl.$^5$ .................. H02M 7/521; H01L 25/00
[52] U.S. Cl. .................. 363/147; 363/132; 361/397; 361/409; 174/260; 174/52.4; 257/728
[58] Field of Search ............... 363/132, 147; 361/395, 361/397, 400, 401, 402, 403, 406, 409, 412, 417, 418, 420, 421; 174/260, 261, 52.1, 52.2, 52.4; 357/41

[56] References Cited

U.S. PATENT DOCUMENTS 4,862,344  8/1989  Emoto ................... 363/147
5,043,859  8/1991  Korman et al. .......... 363/147

*Primary Examiner*—Emanuel T. Voeltz
*Attorney, Agent, or Firm*—Jill M. Breedlove; Marvin Snyder

[57] ABSTRACT

A low-inductance package for multiple paralleled devices includes an electrically insulating substrate having three power terminals direct-bonded to the upper surface thereof and a conductive pad direct-bonded to the lower surface thereof for connection to a heat sink. Two groups of multiple parallel-coupled devices are each soldered to one of the three power terminals and are further connected in a half-bridge configuration such that one of the three power terminals is common to both groups of devices. The package further includes a pair of first Kelvin terminals, i.e., a first Kelvin control terminal and a first Kelvin source terminal, and a pair of second Kelvin terminals, i.e., a second Kelvin control terminal and a second Kelvin source terminal. The Kelvin terminals are soldered to the appropriate power terminals, depending upon the particular circuit configuration. The multiple parallel-coupled devices of each group are aligned such that the lengths of the wire bonds to the respective control and power terminals are substantially the same and furthermore are shortened. As a result, the stray inductance due to the wire bonds is the same for each group of devices and is minimized. Current sharing and simultaneous switching of devices within each group are thus ensured.

20 Claims, 5 Drawing Sheets

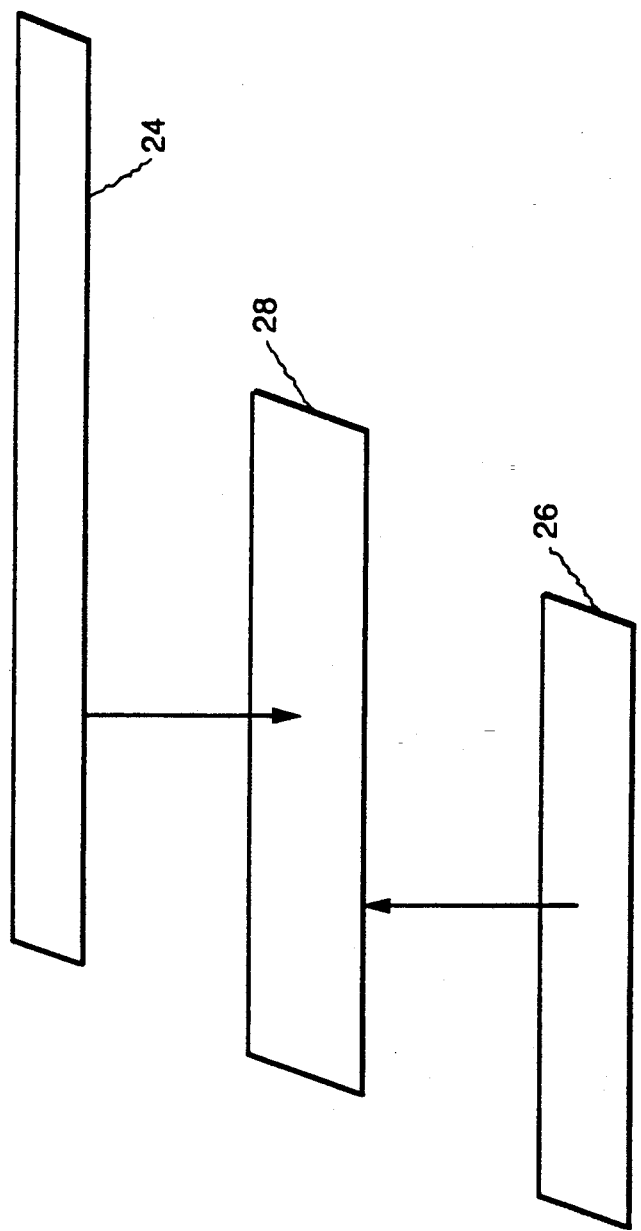

LOW-INDUCTANCE PACKAGE FOR MULTIPLE PARALLELED DEVICES OPERATING AT HIGH FREQUENCY

FIELD OFF THE INVENTION

The present invention relates generally to packages for semiconductor devices and, more particularly, to packages for multiple high-power, high-frequency devices coupled in parallel.

BACKGROUND OF THE INVENTION

To increase power handling capability of power electronic circuits, power semiconductor devices are often connected in parallel by wire bonding devices within a package. However, although wire bonding devices within a package results in much less stray inductance than that resulting from interconnecting discrete devices, the stray inductance is still too high for high-frequency operation. In particular, such stray inductance causes ringing in both device current and voltage in addition to unequal current sharing among parallel-coupled devices.

Radio frequency packages are available that minimize inductance by making the metal leads of the packaged device, or die, as wide as possible. Some packages also enhance the gate drive through a separate, wide return connection from the die known as a Kelvin lead. Disadvantageously, however, the size of such leads limits such packages to a single device. Hence, connecting multiple devices within such packages is impossible. Therefore, half-bridge and full-bridge circuits require the interconnection of multiple device packages, adding stray inductance thereto.

Commonly assigned U.S. Pat. No. 5,043,859 of C. S. Korman et al., issued Aug. 27, 1991 and incorporated by reference herein, describes a low-inductance, half-bridge package including an insulating substrate having first, second and third external power terminals along with control terminals bonded to the substrate. The power terminals are configured to provide a current path straight through the package from the first power terminal to the second (or common) power terminal and from the second power terminal to the third power terminal. The control terminals each preferably comprise pairs of Kelvin terminals in order to minimize feedback from the power current paths to the control circuits. The power devices are bonded to the first and second power terminals, respectively, and have connections to the second and third power terminals, respectively. For single upper and lower half-bridge devices, the package of U.S. Pat. No. 5,043,859 is thus configured to have very low stray inductance for high-frequency operation. However, if multiple devices are coupled in parallel in a half-bridge package such as that of U.S. Pat. No. 5,043,859, the wire bonding length for each power device is different, resulting in an undesirable level of stray inductance which causes unequal current sharing and unequal delays in the devices.

Accordingly, it is desirable to provide an improved low-inductance package for multiple paralleled devices suitable for use in half-bridge and full-bridge circuit configurations.

SUMMARY OF THE INVENTION

A low-inductance package for multiple paralleled devices includes an electrically insulating substrate having three power terminals direct-bonded to the upper surface thereof and a conductive pad direct-bonded to the lower surface thereof for connection to a heat sink. Two groups of multiple parallel-coupled devices are each direct-bonded to one of the three power terminals and are further connected in a half-bridge configuration such that one of the three power terminals is common to both groups of devices. The package further includes a pair of first Kelvin terminals, i.e., a first Kelvin control terminal and a first Kelvin source terminal, and a pair of second Kelvin terminals, i.e., a second Kelvin control terminal and a second Kelvin source terminal. According to a preferred embodiment, the Kelvin terminals each comprise an upper conductive strip and a lower conductive strip direct-bonded to the upper and lower surfaces, respectively, of a small insulating substrate. The upper conductive strips function as package leads to the associated control circuit for the package; and the lower conductive strips are bonded to the appropriate power terminals, depending upon the particular circuit configuration. Alternatively, the Kelvin terminals may each comprise a single conductive strip direct-bonded to a small insulating substrate which, in turn, is direct-bonded to the upper surface of the appropriate power terminal. The multiple parallel-coupled devices of each group are aligned such that the lengths of the wire bonds to the respective control and power terminals are substantially the same and, moreover, are relatively short. As a result, the stray inductance due to the wire bonds is the same for each group of devices and furthermore is minimized. Current sharing and simultaneous switching of devices within each group are thus ensured.

BRIEF DESCRIPTION OF THE DRAWINGS

The features and advantages of the present invention will become apparent from the following detailed description of the invention when read with the accompanying drawings in which:

FIGS. 3a and 3b illustrates how the conductor patterns of the half-bridge of FIG. 2 are direct-bonded to insulating substrates.

DETAILED DESCRIPTION OF THE INVENTION

Figure 1:
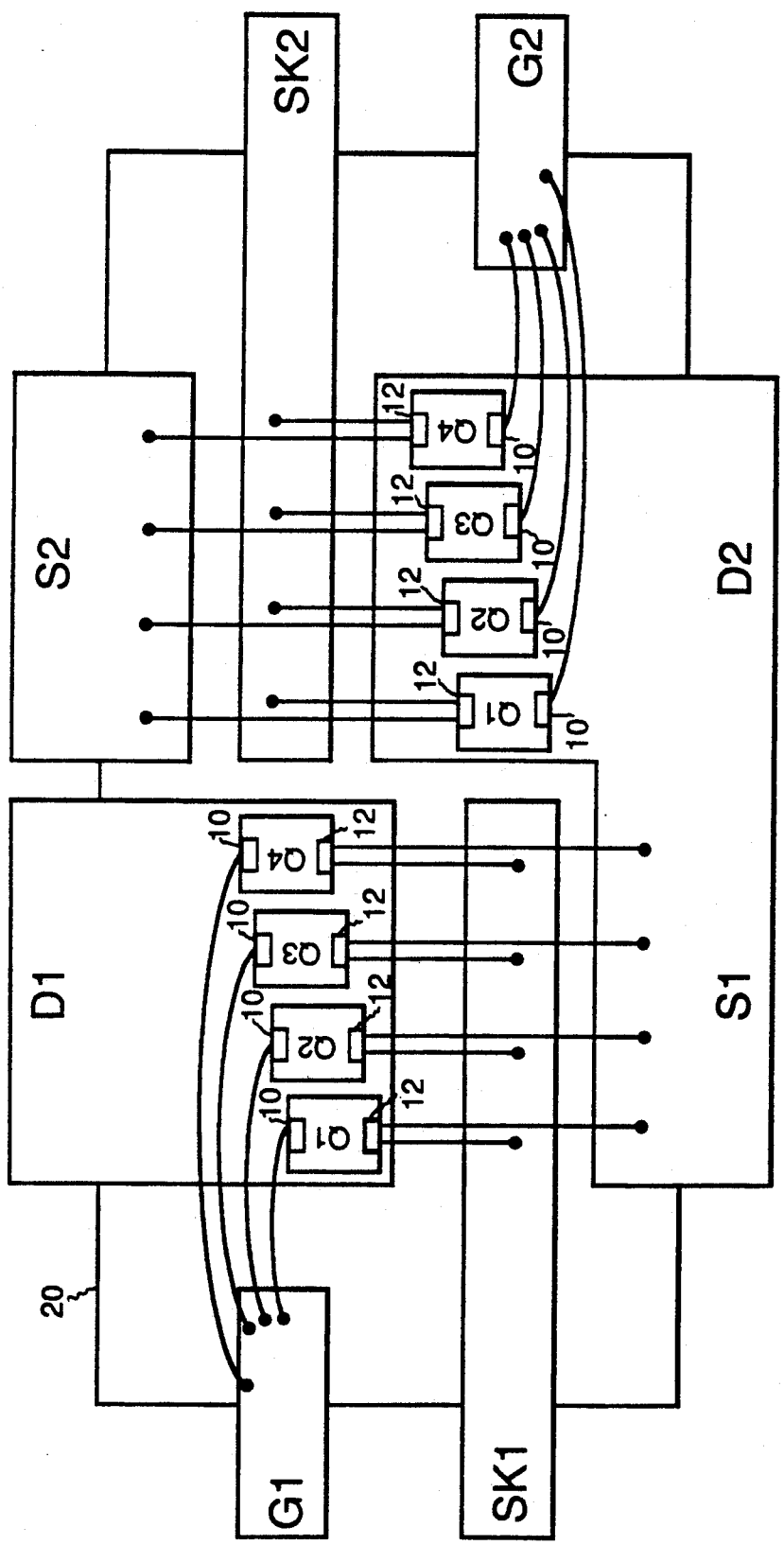
FIG. 1 schematically illustrates a half-bridge package such as that of U.S. Pat. No. 5,043,859 having multiple paralleled devices instead of single half-bridge devices.

FIG. 1 illustrates a half-bridge package such as that of U.S. Pat. No. 5,043,859, cited hereinabove, having multiple paralleled devices instead of single half-bridge devices. In particular, FIG. 1 shows four parallel-coupled devices Q1-Q4 operating as the upper switching device of the half-bridge and four parallel-coupled devices Q5-Q8 operating as the lower switching device of the half-bridge. Exemplary switching devices Q1-Q8 comprise power MOSFET's, such as type IRF240 devices manufactured by International Rectifier Corporation and packaged in conventional TO-220 packages. Each device Q1-Q8 has a gate terminal 10 and a source terminal 12 on the upper surface of the chip and further has a drain terminal (not shown) on the lower surface of the chip.

The half-bridge package of FIG. 1 includes an upper drain terminal D1, a lower source terminal S2, and a source-drain common terminal S1/D2 direct-bonded to an electrically insulating substrate 20 according to well-known methods. A first pair of Kelvin terminals, including a first Kelvin control terminal G1 and a first Kelvin source terminal Sk1, and a second pair of Kelvin terminals, including a second Kelvin control terminal G2 and a second Kelvin source terminal Sk2, are also direct-bonded to substrate 20. Since Kelvin terminals are relatively flat and wide, and since inductance and resistance proportionately decrease as cross sectional area increases, the use of Kelvin terminals substantially reduces the inductance and resistance between the power device half-bridge circuit and the associated control circuit (not shown), thereby substantially avoiding feedback therebetween.

Devices Q1-Q4 are soldered or otherwise bonded to upper drain terminal D1 such that the drain terminal on the lower surface of each of devices Q1-Q4 is directly connected thereto. Similarly, devices Q5-Q8 are soldered or otherwise bonded to common drain-source terminal S1/D2 such that the drain terminal on the lower surface of each of devices Q5-Q8 is directly connected thereto. Gate terminals 10 of upper devices Q1-Q4 are wire-bonded to first Kelvin control terminal G1; and source terminals 12 of upper devices Q1-Q4 are wire-bonded to first Kelvin source terminal Sk1 and to common source-drain terminal S1/D2. Gate terminals 10 of lower devices Q5-Q8 are wire-bonded to second Kelvin control terminal G2; and source terminals 12 of lower devices Q5-Q8 are wire-bonded to second Kelvin source terminal Sk2 and to lower source terminal S2.

As is apparent from FIG. 1, the lengths of the wire bonds is different for each of the paralleled devices. Hence, since the inductance of a wire is proportional to its length, the stray inductance for each device in each group of parallel-coupled devices is different. As a result, the devices turn on and off with different delay times and thus do not share current equally. This effect becomes even more significant at high frequencies, e.g., radio frequencies, since the delay times at such high frequencies are a substantial portion of the total switching cycle. Therefore, to achieve high-efficiency, high-frequency operation, it is desirable to reduce the stray inductance due to the varying lengths of the wire bonds. Furthermore, it is desirable to reduce the lengths of the wire bonds.

Figure 2:
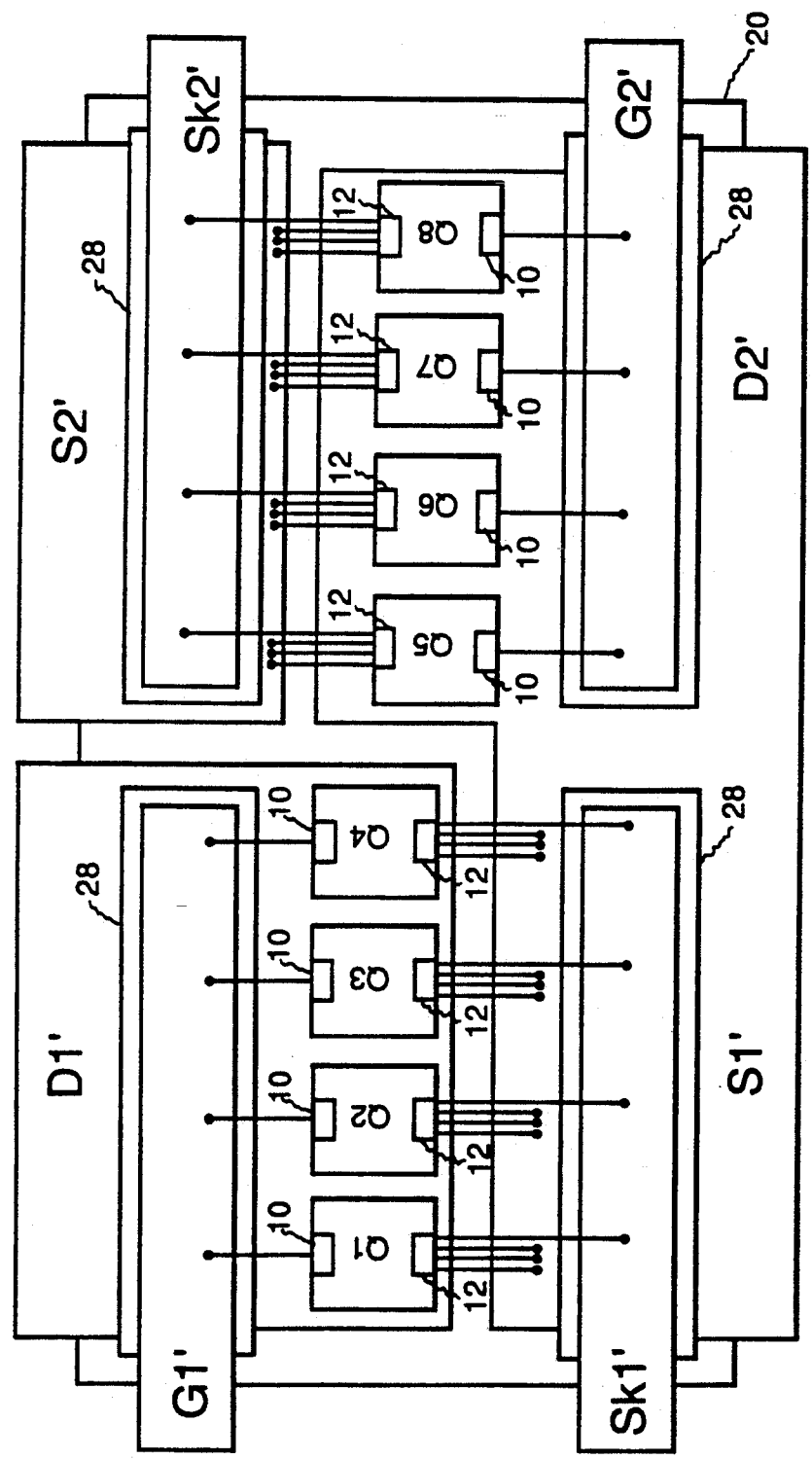
FIG. 2 schematically illustrates an improved half-bridge package with multiple paralleled devices in accordance with the present invention.
Figure 3A:
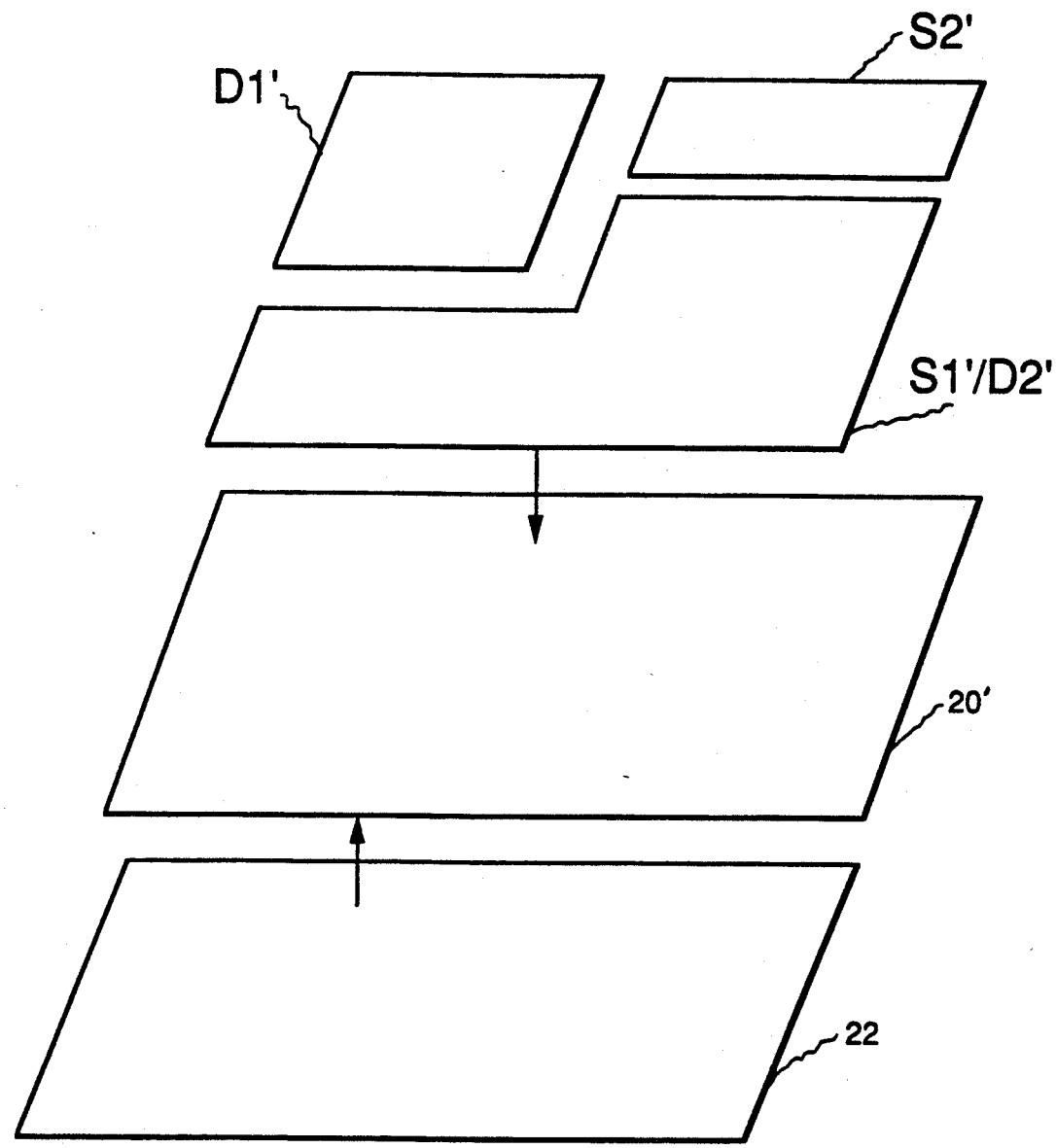

FIG. 2 illustrates an improved half-bridge package for multiple paralleled devices in accordance with the present invention. An upper drain terminal D1', a lower source terminal S2', and a source-drain common terminal S1'/D2' are direct-bonded to the upper surface of an electrically insulating substrate 20', as illustrated in FIG. 3a; and a conductive pad 22 for connection to a heat sink (not shown) is direct-bonded to the lower surface of substrate 20'. Substrate 20' may be comprised of a suitable ceramic, such as one made from alumina or, for even better thermal conductivity, beryllia, silicon carbide or diamond. According to one embodiment of the improved package, as illustrated in FIG. 3b, Kelvin terminals G1', Sk1', G2', and Sk2' each comprise upper and lower conductive strips 24 and 26, respectively, direct-bonded to the upper and lower surfaces, respectively, of a small insulating substrate 28. Upper conductive strips 24 function as the package leads; and lower conductive strips are soldered to the respective terminals D1', S2' or S1'/D2'. Alternatively, Kelvin terminals G1', Sk1', G2', and Sk2' may each comprise one conductive strip 24 direct-bonded to the upper surface of insulating substrate 28, with substrate 28 being direct-bonded to the respective terminals D1', S2' or S1'/D2'

As shown in FIG. 2, upper devices Q1-Q4 and lower devices Q5-Q8 are respectively soldered to upper drain terminal D1' and lower source terminal S2', respectively, so that their drain terminals (not shown) are directly connected thereto. Gate terminals 10 of upper devices Q1-Q4 are wire-bonded to first Kelvin control terminal G1'; and source terminals 12 of upper devices Q1-Q4 are wire-bonded to first Kelvin source terminal Sk1' and to common source-drain terminal S1'/D2'. Similarly, gate terminals 10 of lower devices Q5-Q8, are wire-bonded to second Kelvin control terminal G2'; and source terminals 12 of lower devices Q5-Q8 are wire-bonded to second Kelvin source terminal Sk2' and to lower source terminal S2'. Preferably, as shown, the connections to source terminals 12 of devices Q1-Q8 are made with several small wire bonds, rather than single wire bonds, in order to further reduce inductance. On the other hand, only single wire bonds are used to make the connections to Kelvin terminals G1', Sk1', G2' and Sk2' because only minimal current flows in the gate circuit of a power MOSFET. Advantageously, in the half-bridge package configuration of the present invention, the paralleled devices Q1-Q4 and Q5-Q8, respectively, are aligned such that the wire bonds to the respective terminals have the same length. As a result, the inductance for each wire bond is substantially the same. Hence, current is shared equally by the parallel-coupled devices, and the parallel-coupled devices have the same delay times.

Figure 4:
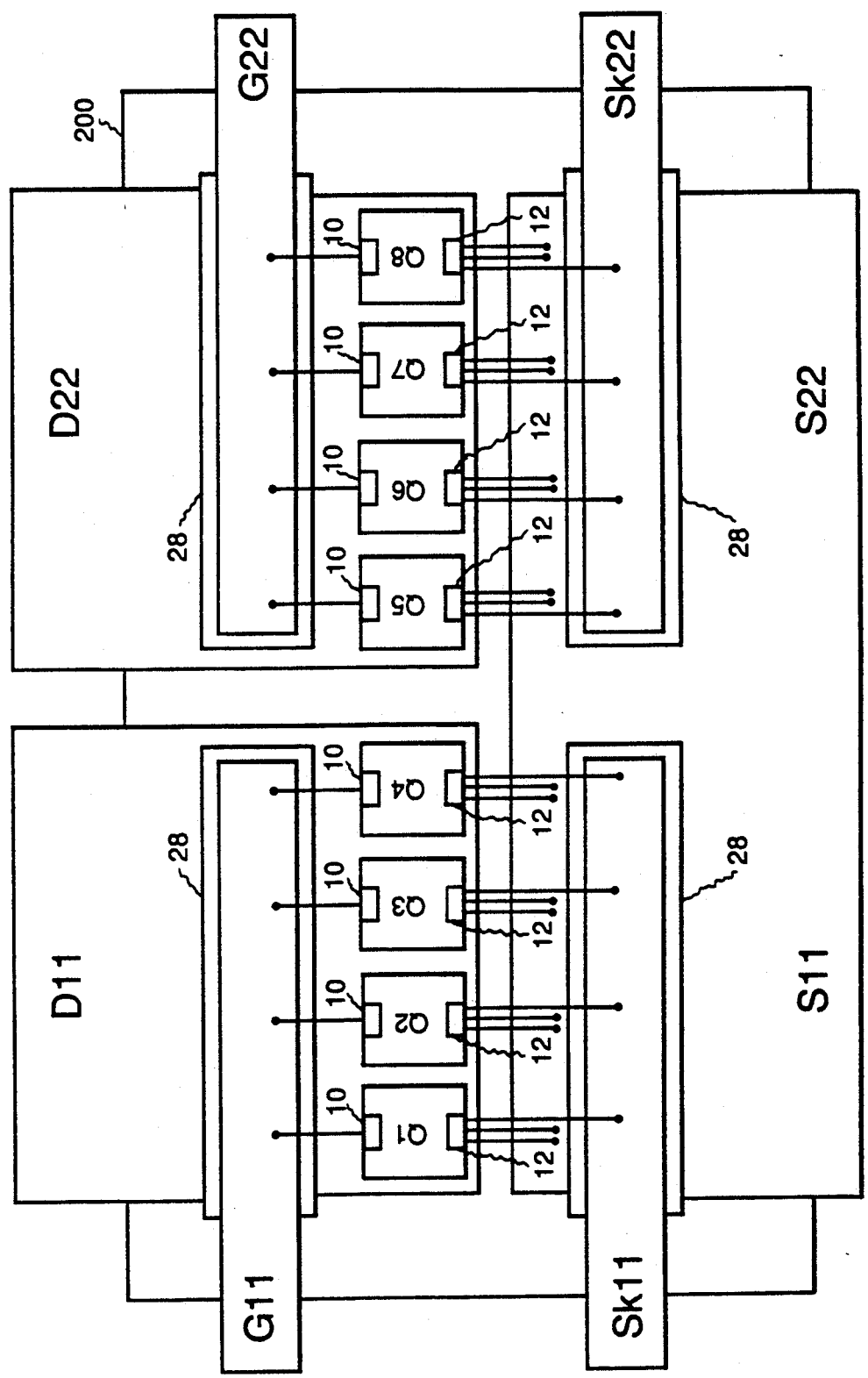
FIG. 4 illustrates an improved package according to the present invention for a push-pull circuit configuration.

Two half-bridge packages, such as those of FIG. 2, may be coupled in known fashion to form a full-bridge circuit, as described in U.S. Pat. No. 5,043,859, cited hereinabove. Moreover, the packaging principles of the present invention do not only apply to bridge configurations having a common source-drain terminal, such as the circuit described hereinabove, but may be employed to package other types of switching device circuit configurations, such as, for example, a well-known push-pull type circuit configuration wherein the source terminals of two devices, or preferably two groups of parallel-coupled devices, are connected together. For example, in the push-pull package of FIG. 4, an upper drain terminal D11, a lower drain terminal D22, and a common source S11/S22 terminal are direct-bonded to a ceramic substrate 200. The gate terminals 10 of four upper switching devices Q1-Q4 are wire-bonded to a first Kelvin control terminal G11; and the source terminals 12 of the four upper switching devices are wire-bonded to a first Kelvin source terminal Sk1 and to common source terminal S11/S22. Similarly, the gate terminals 10 of four lower switching devices Q5-Q8 are wire-bonded to a second Kelvin control terminal G22; and the source terminals 12 of the four lower switching devices are wire-bonded to a second Kelvin source terminal Sk2 and to common source terminal S11/S22.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A semiconductor device package, comprising:
   an electrically insulating substrate;
   three power terminals bonded to said substrate
   a first group of parallel-coupled switching devices mounted on, and electrically connected to, a first one of said three power terminals;
   a second group of parallel-coupled switching devices mounted on, and electrically connected to, a second one of said three power terminals;
   first and second control terminals bonded to said substrate for connection to a control circuit;
   said first and second groups of switching devices being configured and aligned on said substrate, and said first and second control terminals being configured, such that corresponding connections between said switching devices and said power terminals and between said switching devices and said control terminals have substantially equal, minimal inductances, whereby the parallel-coupled switching devices of each said group share substantially equal current and switch on and off substantially simultaneously.

2. The semiconductor device package of claim 1 wherein said first and second control terminals each comprise a pair of Kelvin terminals.

3. The semiconductor device package of claim 2 wherein said Kelvin terminals are each disposed on, and electrically insulated from, one of said power terminals.

4. The semiconductor device package of claim 3 wherein said Kelvin terminals each have substantially the same length.

5. The semiconductor device package of claim 1 wherein said substrate is comprised of an electrically insulating material selected from the group consisting of alumina, beryllia, silicon carbide and diamond.

6. The semiconductor device package of claim 1 wherein said first and second groups of parallel-coupled switching devices are configured as a half-bridge circuit.

7. The semiconductor device package of claim 6 wherein said first and second control terminals each comprise a pair of Kelvin terminals.

8. The semiconductor device package of claim 7 wherein said Kelvin terminals are each disposed on, and electrically insulated from, one of said power terminals.

9. The semiconductor device package of claim 8 wherein said Kelvin terminals each have substantially the same length.

10. The semiconductor device package of claim 6 wherein said substrate is comprised of an electrically insulating material selected from the group consisting of alumina, beryllia, silicon carbide and diamond.

11. The semiconductor device package of claim 6 wherein said three power terminals respectively comprise an upper drain terminal, a lower source terminal, and a common source-drain terminal.

12. The semiconductor device package of claim 11 wherein said upper drain and lower source terminals are situated adjacent to each other and opposite said common source-drain terminal.

13. The semiconductor device package of claim 12 wherein said first and second control terminals each comprise a pair of Kelvin terminals, one of said pairs of Kelvin terminals comprising a first Kelvin control terminal and a first Kelvin source terminal, and the other of said pairs of Kelvin terminals comprising a second Kelvin control terminal and a second Kelvin source terminal.

14. The semiconductor device package of claim 13 wherein:
   said Kelvin terminals each have substantially the same length;
   said first Kelvin control terminal is disposed on, and electrically insulated from, said upper drain terminal;
   said second Kelvin source terminal is disposed on, and electrically insulated from, said lower source terminal such that said first Kelvin control terminal and said second Kelvin source terminal are situated opposite to each other on said substrate;
   said first Kelvin source terminal and said second Kelvin control terminal are disposed opposite to each other on, and electrically insulated from, said common source-drain terminal.

15. The semiconductor device package of claim 14 wherein:
   said first group of parallel-coupled switching devices is mounted on said upper drain terminal;
   said second group of parallel-coupled switching devices is mounted on said common source-drain terminal and rotated about 180° with respect to said first group of switching devices;
   the gates of said first group of switching devices are bonded to said first Kelvin control terminal;
   the sources of said first group of switching devices are bonded to said common source-drain terminal and said first Kelvin source terminal;
   the gates of said second group of switching devices are bonded to said second Kelvin control terminal; and
   the sources of said second group of switching devices are bonded to said lower source terminal and said second Kelvin source terminal.

16. The semiconductor device package of claim 1 wherein said switching devices are arranged in a push-pull configuration, said three power terminals respectively comprising an upper drain terminal, a lower drain terminal, and a common source terminal.

17. The semiconductor device package of claim 16 wherein said upper and lower drain terminals are situated adjacent to each other and opposite said common source terminal.

18. The semiconductor device package of claim 17 wherein said first and second control terminals each comprise a pair of Kelvin terminals, one of said pairs of Kelvin terminals comprising a first Kelvin control terminal and a first Kelvin source terminal, and the other of said pairs of Kelvin terminals comprising a second Kelvin control terminal and a second Kelvin source terminal.

19. The semiconductor device package of claim 18 wherein:
   said Kelvin terminals each have substantially the same length;
   said first Kelvin control terminal is disposed on, and electrically insulated from, said upper drain terminal;
   said second Kelvin control terminal is disposed on, and electrically insulated from, said lower drain terminal such that said first Kelvin control terminal and said second Kelvin control terminal are situated opposite to each other on said substrate;

said first Kelvin source terminal and said second Kelvin source terminal are disposed opposite to each other on, and electrically insulated from, said common source terminal.

20. The semiconductor device package of claim 19 wherein:

said first group of parallel-coupled switching devices is mounted on said upper drain terminal;

said second group of parallel-coupled switching devices is mounted on said common source-drain terminal and rotated about 180° with respect to said first group of switching devices;

the gates of said first group of switching devices are bonded to said first Kelvin control terminal;

the sources of said first group of switching devices are bonded to said common source terminal and said first Kelvin source terminal;

the gates of said second group of switching devices are bonded to said second Kelvin control terminal; and the sources of said second group of switching devices are bonded to said common source terminal and said second Kelvin source terminal.

* * * * *